United States Patent
Tanaka (10) Patent No.: US 9,973,165 B2
(45) Date of Patent: May 15, 2018

(54) VARIABLE GAIN AMPLIFIER AND DRIVER IMPLEMENTING THE SAME

(71) Applicant: SUMITOMO ELECTRIC INDUSTRIES, LTD., Osaka-shi, Osaka (JP)

(72) Inventor: Keiji Tanaka, Yokohama (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 0 days. days.

(21) Appl. No.: 15/297,892

(22) Filed: Oct. 19, 2016

(65) Prior Publication Data

US 2017/0117863 A1 Apr. 27, 2017

(30) Foreign Application Priority Data

Oct. 22, 2015 (JP) ................. 2015-207836

(51) Int. Cl.
| | |
|---|---|
| H03F 3/45 | (2006.01) |
| H03G 3/30 | (2006.01) |
| H04B 10/50 | (2013.01) |
| H03F 1/32 | (2006.01) |
| H03F 3/21 | (2006.01) |
| H03G 1/00 | (2006.01) |
| H04B 1/04 | (2006.01) |

(52) U.S. Cl.
CPC ......... *H03G 3/3084* (2013.01); *H03F 1/3211* (2013.01); *H03F 3/211* (2013.01); *H03F 3/45089* (2013.01); *H03F 3/45103* (2013.01); *H03F 3/45174* (2013.01); *H03F 3/45475* (2013.01); *H03G 1/0023* (2013.01); *H03G 1/0035* (2013.01); *H03G 1/0082* (2013.01); *H04B 10/50* (2013.01); *H04B 10/501* (2013.01); *H03F 2200/339* (2013.01); *H03F 2200/462* (2013.01); *H03F 2203/45241* (2013.01); *H03F 2203/45318* (2013.01); *H03F 2203/45366* (2013.01); *H04B 1/04* (2013.01); *H04B 2001/0416* (2013.01)

(58) Field of Classification Search
CPC .................................................. H03G 3/3084
USPC .................................................. 330/252-261
See application file for complete search history.

(56) References Cited

U.S. PATENT DOCUMENTS

| | | |
|---|---|---|
| 5,079,515 A | 1/1992 | Tanimoto |
| 7,076,226 B2 | 7/2006 | Bult et al. |

OTHER PUBLICATIONS

R.G Mayer et al., "A DC to 1-GHz Differential Monolithic Variable-Gain Amplifier", IEEE, JSSC, pp. 1673-1680, vol. 26, No. 11, Nov. 1991.

*Primary Examiner* — Khanh V Nguyen
*Assistant Examiner* — Khiem Nguyen
(74) *Attorney, Agent, or Firm* — Global IP Counselors, LLP (57) ABSTRACT

A driver that drives an optical device, such as laser diode (LD) and/or optical modulator, is disclosed. The driver includes a variable gain amplifier (VGA) and a post amplifier. The post amplifier amplifies an output of the VGA to a preset amplifier as varying the gain of the VGA. The VGA includes two differential pairs each amplify the input signal oppositely in phases thereof and outputs of the differential pairs are compositely provided to the post amplifier. The gain of the VGA is varied by adjusting contribution of the second differential pair to the output of the VGA.

7 Claims, 8 Drawing Sheets

VARIABLE GAIN AMPLIFIER AND DRIVER IMPLEMENTING THE SAME

CROSS-REFERENCE TO RELATED APPLICATIONS

This U.S. National stage application claims priority under 35 U.S.C. § 119(a) to Japanese Patent Application No. 2015-207836, filed in Japan on Oct. 22, 2015, the entire contents of which are hereby incorporated herein by reference.

BACKGROUND OF THE INVENTION

The present invention relates to a variable gain amplifier (VGA) and a driver implementing the VGA for driving an optical device.

Recently, advanced algorithms have been requested in the optical communication system as the transmission speed has become faster. New algorithms are, for instance, the amplitude modulation by multi-levels, the phase modulation, and a combination of these two modulations, which is sometimes called as the quadrature amplitude modulation (QAM) by $2^2 n$ (n=2, 3 . . . ) levels, namely, 16 QAM, 64 QAM and so on.

In the multi-level modulation, an apparatus is requested to amplify a signal generated by, for instance, a digital-to-analog converter (DAC) to an enough amplitude for driving an optical device linearly. That is, the apparatus implemented within the QAM system is necessary to have an enough dynamic range. An optical transmitter in the QAM system is often designed specific to the QAM system. For instance, one type of a driver with a function of a variable gain is often used in the QAM system because such a variable gain amplifier (VGA) may amplify a signal with a wide dynamic range in the amplitude thereof to a preset amplitude (a saturated amplitude) as keeping a linearity thereof. A prior document by Mayer et. al in IEEE, JSSC 26(11) (1991) has disclosed one type of a VGA. While, United States Patents, U.S. Pat. No. 7,076,226 and U.S. Pat. No. 5,079,515, have disclosed a technique to enhance the linearity of a VGA.

The VGA disclosed in the IEEE document increases an operating current to enhance the linearity thereof, which directly results in the increase in the power consumption. A VGA disclosed in U.S. Pat. No. 7,076,226 has increased the linearity thereof by cancelling a portion of a trans-conductance of an active device, which is equivalent to reduce a gain thereof. Accordingly, in order to attain a preset gain, two or more stages of the amplifiers are necessary to be installed, which means that the power consumption unavoidably increases. A VGA disclosed in another patent document, U.S. Pat. No. 5,079,515, requires for attaining an enhanced linearity that an input signal has preset amplitude.

SUMMARY OF THE INVENTION

One aspect of the present application relates to a driver that drives an optical device, such as a laser diode (LD) and/or an optical modulator. The driver includes a variable gain amplifier (VGA), an amplitude detector, and a gain controller. The amplitude detector may detect amplitude of the output of the driver and compare the detected amplitude with preset amplitude. The gain controller may generate a gain control signal, which makes the detected amplitude closer to the preset amplitude, to the VGA. The VGA, depending on the gain determined by the gain control signal, amplify an input differential signal. A feature of the driver of the present invention is that that VGA includes a first current source, a first differential pair, a second differential pair, a gain control circuit, a first output resistor, and a second current source. The first current source provides a first source current. The first differential pair, depending on the input differential signal, divers the first source current into a couple of first currents complementary to each other as a first output current. The second differential pair, depending on the input differential signal, divides a second source current into a couple of second currents complementary to each other as a second output current, where the second output current has phase opposite to phase of the first output current. The gain control circuit, depending on the gain control signal, divides a sum of the first output current and the second output current into a couple of third currents. The first output resistor generates the output signal caused by a voltage drop by one of the third currents flowing therein. The second current source generates the second source current that reflects another of the third currents.

Another aspect of the present invention relates to a variable gain amplifier (VGA) that generates an output signal by amplifying an input differential signal with a variable gain determined by a gain control signal, which is externally provided. The VGA of the invention includes a first current source, a first differential pair, a second differential pair, a gain control circuit, a first output resistor, and a second current source. The first current source provides a first source current. The first differential pair, depending on the input differential signal, divides the first source current into a couple of first output currents. The second differential pair, depending on the input differential signal, divides a second source current into a couple of second output currents, where the second output currents have phases opposite to phases of the first output currents. The gain control circuit divides a sum of one of the first output currents and one of the second output currents into a couple of third currents. The first output resistor generates the output signal caused by a voltage drop by one of the third currents flowing therein. The second current source reflects the another of the third currents in the second source current.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENT

Next, embodiment of a driver according to the present invention will be described as referring to accompany drawings. In the description of the drawings, numerals or symbols same with or similar to each other will refer top elements same with or similar to each other without duplicating explanations. Also, a context 'transistor' may include both of a bipolar transistor and a field effect transistor (FET). Explanations below concentrate on a case where the 'transistor' is the bipolar transistor, but the explanation may be easily applicable to the FET by replacing a base, an emitter, and a collector to a gate, a source, and a drain, respectively.

Figure 1:
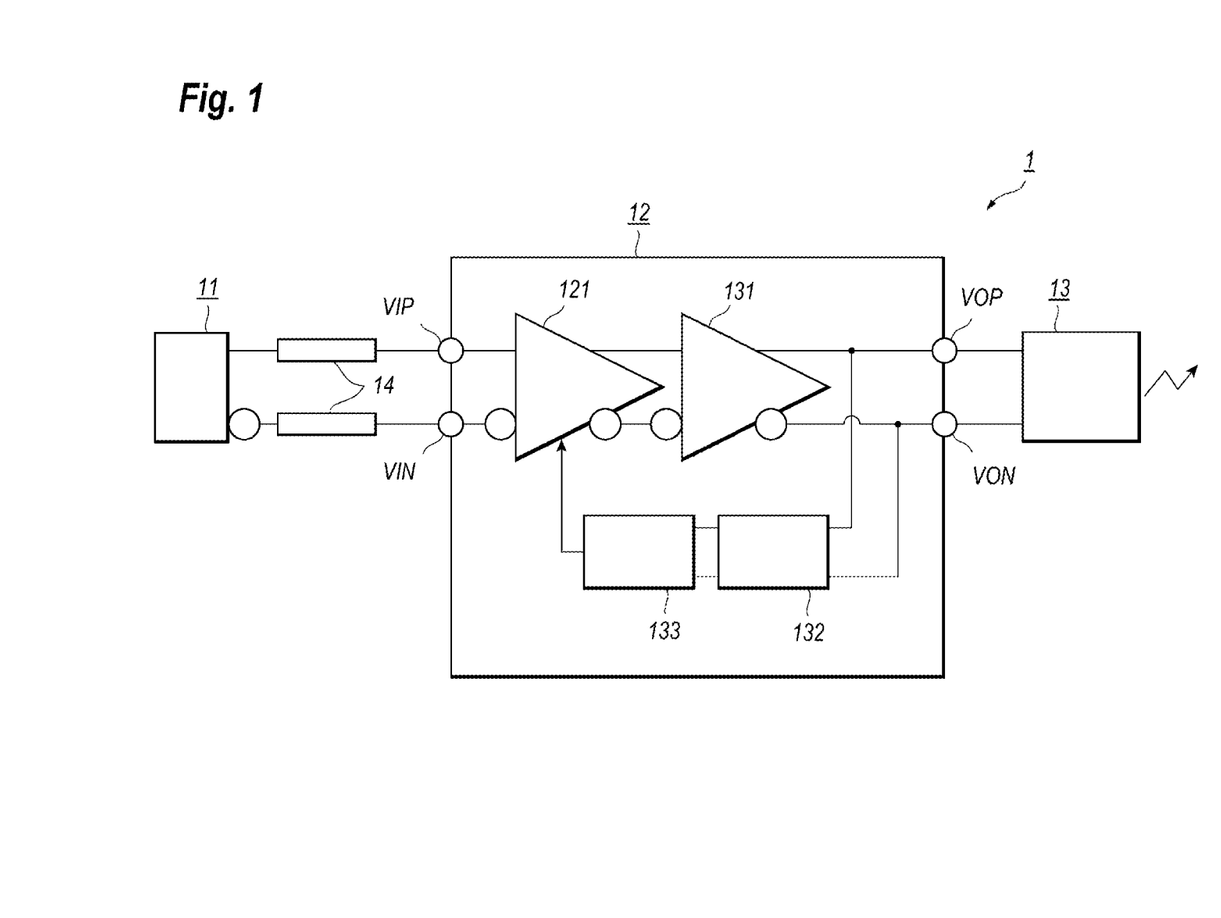
FIG. 1 shows a functional block diagram of an optical transmitter implementing a driver of the present invention.

As shown in FIG. 1, an optical transmitter 1 includes a DAC 11, a driver 12, and a laser or an optical modulator 13. The optical transmitter 1 may be implemented within an optical transceiver that transmits and receives wavelength-multiplexed optical signals each containing four optical signals in a 1300 nm band, which shows transmission capacity of 40 Gbps or 100 Gbps (giga-bit per second). FIG. 1 shows an arrangement of the optical transmitter processing only one optical signal among the four signals.

The DAC 11 may convert an electrical signal, which is provided from an external device (not shown in FIG. 1) into an analog signal and provides thus converted analog signal, which may be a differential signal, to the driver 12. The differential signal provided from the DAC 11 enters input terminals, VIP and VIN, of the driver 12 through transmission lines 14.

The driver 12 may generate a driving signal that drives the LD or the optical modulator whose optical output is modulated by the driving signal based on the input differential signal provided from the DAC 11. The driver 12 includes a variable gain amplifier (VGA) 121, a post amplifier 131, a amplitude detector 132, and a gain controller 133.

The VGA 121, which is a driving circuit to modulate the light output from the LD or the optical modulator 13, has a differential configuration that amplifies the input differential signal. The VGA 121 may vary the gain thereof depending on a gain control signal. Details of the VGA 121 will be described later in this specification. The post amplifier 131 further amplifies a signal amplified by and output from the VGA 121. The post amplifier 131 amplifies the signal with a preset constant gain different from the VGA 121. The post amplifier 131 amplifies the signal to a level with amplitude enough to modulate the LD or the optical modulator 13. A signal output from the post amplifier 131 is provided to the LD or the optical modulator 13 as the driving signal that modulates the LD or the optical modulator 13. The amplitude detector 132 detects amplitude of the driving signal output from the post amplifier 131 and output to an external of the driver 12. The amplitude detector 132 provides information indicating the amplitude of the driving signal to the gain controller 133. The gain controller 133 compares the information provided from the amplitude detector 132 with target amplitude of the driving signal of the driver 12, which is memorized in advance to a practical operation of the optical transmitter 1, evaluates a difference therebetween, and provides the gain control signal based on this difference. The gain control signal sets the driving signal, which is amplified by the VGA 121 and the post amplifier 133, such that the amplitude thereof becomes the target amplitude. The VGA 121, receiving the gain control signal from the gain controller 133, varies the gain thereof. Thus, the driver 12 generates the driving signal whose amplitude is kept constant in the target amplitude by the variable gain operation of the VGA 121 based on the gain control signal provided from the gain controller 133.

The LD or the optical modulator 13 may be a type of distributed feedback (DFB) LD, Fabry-Perot (FP) LD, and/or vertical cavity surface emitter laser (VCSEL) when the LD is made of semiconductor materials, or a type of electro-absorption (EA) modulator, or Mach-Zehnder (MZ) modulator for the optical modulator. The LD or the optical modulator 13 may output the light modulated by the driving signal provided from the driver 12.

Figure 2:
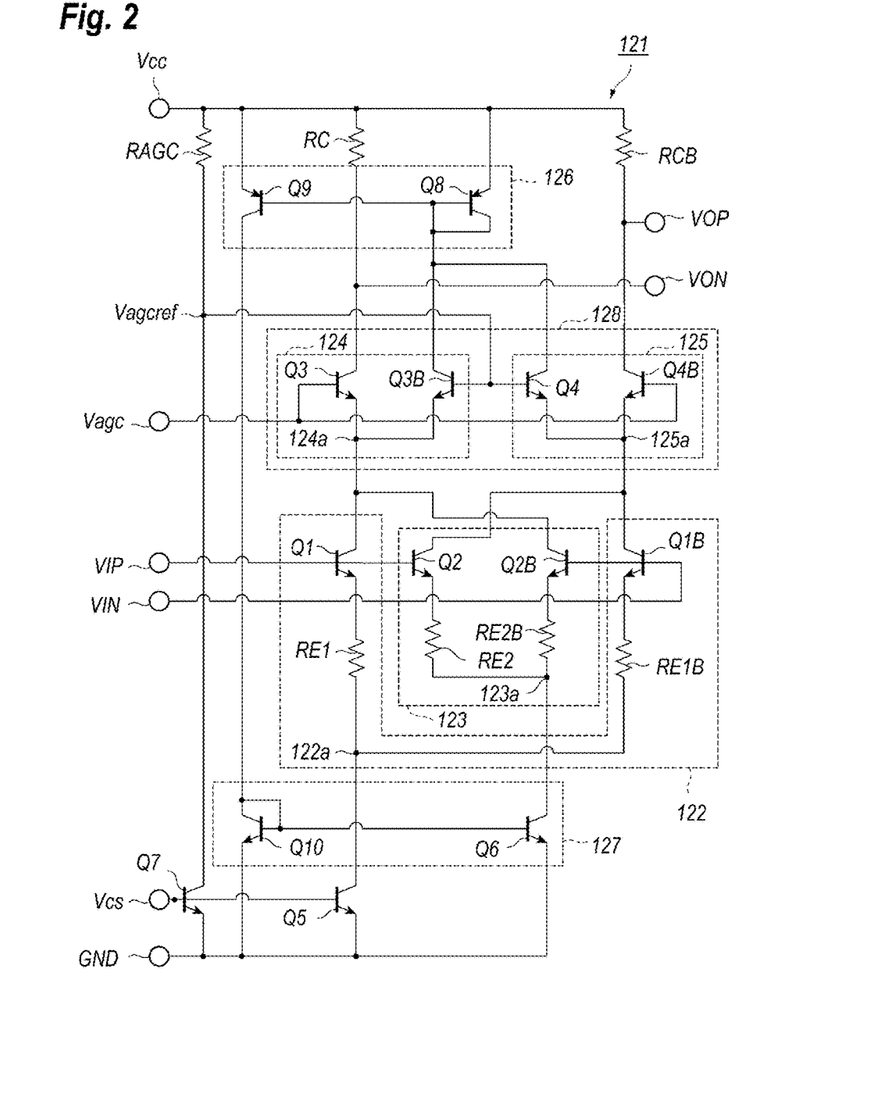
FIG. 2 shows a circuit diagram of a variable gain amplifier implemented within the driver shown in FIG. 1.

Next, details of the VGA 121 will be described as referring to FIG. 2. As shown in FIG. 2, the VGA 121 includes a first differential pair 122, a second differential pair 123, a gain control circuit 128, a first current mirror circuit 126, and a second current mirror circuit 127. The gain control circuit 128 includes a third differential pair 124 and the fourth differential pair 125.

The first differential pair 122 includes a pair of transistors, Q1 and Q1B, and a current node 122a. The transistors, Q1 and Q1B, are a type of npn-bipolar transistor. The transistors, Q1 and Q1B, in emitters thereof are connected to the current node 122a through resistors, RE1 and RE1B.

A circuit including two transistors whose emitters are commonly connected is generally called as a differential pair like the differential pairs, 122 to 125, above described. The first differential pair 122 may connect respective emitters through emitter resistors, RE1 and RE1B, or, directly connect to each other without any emitter resistors. The first differential pair 122 divides, depending on a difference between a base bias of the transistor Q1 and that of the other transistor Q1B, the current flowing in the current node 122a into two parts, one of which flows in the transistor Q1, while, the other flows in the transistor Q1B. The current flowing in the transistor Q1 may be a collector current of the transistor Q1, and the other current flows in the transistor Q1B may be also a collector current of the transistor Q1B.

When the base bias supplied to the transistor Q1 exceeds the base bias supplied to the other transistor Q1B, the current flowing in the current terminal 122a in almost whole part thereof flows in the transistor Q1. On the other hand, when the base bias to the transistor Q1B becomes greater than that to the transistor Q1, the current flowing in the current node 122a in a whole part thereof flows in the transistor Q1. When the base biases to the respective bases become comparable to each other, the current flowing in the current node 122a may be evenly divided into two transistors, Q1 and Q1B.

The current node 122a is connected to the transistor Q5 that operates as a first current source. Specifically, the transistor Q1 in the collector thereof is connected to the current node 122a, and the emitter thereof is grounded. The base of the transistor Q1, which is the first base, receives a positive component of the input differential signal provided to the input terminal VIP through the transmission line 14. The base of the other transistor Q1B, which is the second base, receives a negative component of the input differential signal provided to the input terminal VIN through the transmission line 14. The positive and negative components of the input differential signal provided to the input terminals, VIP ad VIN, are a pair of signals each having a phase different by 180° and varying complementarily. A difference between the positive component and the negative component becomes the differential signal. ??

The VGA 121 amplifies the differential signal. The input terminal VIP is a terminal to which the positive components of the input differential signal enters, while, the other terminal VIN is a terminal to which the negative component of the input differential signal enters. The collectors of the transistors, Q1 and Q1B, are connected to current nodes, 124a and 125a, where the former current node 124a is the third current node and the latter current node 125a is the fourth current node.

The VGA 121 provides the differential output terminals, VOP and VON. One of the differential output terminals VON, which is coupled to the collector of the transistor Q3, is the first output terminal. Specifically, the output terminal VON is coupled to the current node 124a through the transistor Q3, whose operation will be described later, while, the other of the output terminal VOP, which is coupled to the collector of the transistor Q4B, is the second output terminal. Specifically, the output terminal VOP is connected to the current node 125a through the transistor Q4B, whose operation is also described later. Thus, the first differential pair 122 divides the current provided from the transistor Q5 into the current flowing in the current node 124a and the other current flowing in the other current node 125a depending on the input differential signal. The base of the transistor Q5 receives a base bias through a terminal Vcs. The base bias may determine the collector current or maintain the collector current in constant independent of a temperature or a variation in a power supply Vcc.

The second differential pair 123 includes two transistors, Q2 and Q2B, and the current node 123a (the second current node), where these two transistors, Q2 and Q2B, are a type of npn-bipolar transistor. Two transistors, Q2 and Q2B, in respective emitters thereof are commonly connected to the current node 123a through emitter resistors, RE2 and RE2B.

A circuit including two transistors whose emitters are commonly connected is generally called as a differential pair (the second differential pair 123). The second differential pair 123 may connect respective emitters through emitter resistors, RE2 and RE2B, or, directly connect to each other without any emitter resistors. The second differential pair 123 divides, depending on a difference between a base bias of the transistor Q2 and that of the other transistor Q2B, the current flowing in the current node 123a into two parts, one of which flows in the transistor Q2, while, the other flows in the transistor Q2B. The current flows in the transistor Q2 is a collector current of the transistor Q2, and the other current flows in the transistor Q2 is also a collector current of the transistor Q2B.

When the base bias supplied to the transistor Q2 exceeds the base bias supplied to the other transistor Q2B, the current flowing in the current terminal 123a in almost whole part thereof flows in the transistor Q2. On the other hand, when the base bias to the transistor Q2B becomes higher than the base bias to the transistor Q2, the current flowing in the current node 123a in a whole part thereof flows in the transistor Q2B. When the base biases to the respective transistors, Q2 and Q2B, become comparable to each other, the current flowing in the current node 123a may be evenly divided into two transistors, Q2 and Q2B.

The current node 123a is connected to the transistor Q6 that operates as a second current source. Specifically, the transistor Q6 in the collector thereof is connected to the current node 123a, and the emitter thereof is grounded. The base of the transistor Q2, which is the third base, receives the positive component of the input differential signal provided to the input terminal VIP. The base of the other transistor Q2B receives the negative component of the input differential signal provided to the input terminal VIN.

The collectors of the transistors, Q2 and Q2B, which are a third collector and a fourth collector, are connected to the current nodes, 125a and 124a, respectively. The current node 125a, as described above, is connected to the transistor Q1B; that is, the collectors of the transistors, Q2 and Q1B, are commonly connected to each other. Also, the current node 124a, as described above, is connected to the collector of the transistor Q1. Accordingly, the collectors of the transistors, Q2B and Q1, are commonly connected. Thus, the second differential pair 123 may divide, depending on the input differential signal, the current provided from the transistor Q6 into two parts, one of which flows in the current node 125a, while, the other flows in the other current node 124a.

The gain control circuit 128 increases or decreases the current provided to the transistor Q1 from a resistor RC and the other current provided to the transistor Q1B from another resistor RCB. The gain control circuit 128 includes a third differential pair 124 and a fourth differential pair 125. The third differential pair 124 includes transistors, Q3 and Q3B, of a type of npn-bipolar transistor. The transistors, Q3 and Q3B, in emitters thereof are commonly connected to the current node 124a.

The third differential pair 124, based on a difference between the base biases thereof, divides the current flowing in the current node 124a into two transistors, Q3 and Q3B. The current node 124a is coupled to the collectors of the transistors, Q1 and Q2B. The transistor Q3 in the base thereof is connected to a gain control terminal Vagc that receives the gain control signal. Controlling the gain control signal applied to the gain control terminal Vagc, the VGA 121 may maintain the amplitude of the driving signal output from the driver 12 in constant. That is, the driver 12 maintains the amplitude of the driving signal generated by amplifying the input differential signal in constant by adjusting the gain control signal depending on the amplitude of the input differential signal. ?? The gain control signal input to the gain control terminal Vagc may be provided from the gain controller 133.

The transistor Q3B in the base thereof receives a reference signal from a reference node Vagcref that is connected to the power supply Vcc through a resistor RAGC and grounded through a transistor Q7 that operates as a current source. The resistor RAGC and the transistor Q7 may determine a level of the reference node Vagcref. The transistor Q3 in the collector thereof is coupled to the power supply Vcc through the load resistor RC and to the output terminal VON of the VGA 121. The output terminal VON outputs a signal to the post amplifier 131, where a level of the signal may vary depending on a voltage drop caused in the resistor RC by the collector current flowing in the transistor Q3.

As described, the current flowing in the current node 124a is divided, depending on the reference signal and the gain control signal, in two parts, one of which flows in the transistor Q3 and the other flows in the transistor, Q3B, where the former current contributes the output signal by flowing in the resistor RC, but the latter current causes no contribution to the output signal. Accordingly, because the output signal may be generated by the amplification, the current contributing the output signal contributes the amplification of the VGA 121, but the current not contributing the output signal causes no contribution to the amplification of the VGA 121. Thus, varying distribution of the currents flowing in the transistors, Q3 and Q3B, which varies the gain of the VGA 121, the output signal in the magnitude thereof varies. The collector of the transistor Q3B is connected to the collector of the first current mirror circuit 126.

The fourth differential pair 125 includes transistors, Q4 and Q4B, of a type of npn-bipolar transistor. The transistors, Q4 and Q4B, in the emitters thereof are commonly connected to the current node 125a, thus forming the differential pair (the fourth differential pair) 125.

The fourth differential pair 125 divides the current flowing in the current node 125a into two parts, depending on a difference between the base biases of the transistors, Q4 and Q4B. The current node 125a is connected to the collectors of the transistors, Q1B and Q2. The transistor Q4B in the base thereof is connected to the gain control terminal Vagc.

The transistor Q4 in the base thereof is connected to the reference node Vagcref. The transistor Q4B in the collector thereof receives the power supply Vcc through the other load resistor RCB, and the output terminal VOP of the VGA 121 to output a signal to the post amplifier 131. The signal output from the output terminal VOP in the level thereof may vary depending on a voltage drop measured from the power supply Vcc and caused in the other load resistor RCB due to the collector current of the transistor Q4B flowing therein.

As described, the current flowing in the current node 125a is divided, depending on the reference signal and the gain control signal, in two parts, one of which flows in the transistor Q4B and the other flows in the transistor Q4, where the former current contributes the output signal by flowing in the other resistor RCB, but the latter current causes no contribution to the output signal. Accordingly, because the output signal may be generated by the amplification, the current contributing the output signal contributes the amplification of the VGA 121, but the current not contributing the output signal causes no contribution to the amplification of the VGA 121. Thus, varying the distribution of the currents flowing in the transistors, Q4 and Q4B, which varies the gain of the VGA 121, the output signal in the magnitude thereof varies. The collector of the transistor Q4 is connected to the collector of the first current mirror circuit 126, more specifically, the transistor Q4 in the collector thereof is biased by the power supply Vcc through the transistor Q8 to which the transistor Q3B in the collector thereof is commonly connected.

The power supply Vcc may provide the current flowing in the transistors, Q3B and Q4, through the first current mirror circuit 126 depending on the bias supplied to the gain control terminal Vagc. The currents flowing in the transistors, Q2 and Q2B, flow into the ground through the second current mirror circuit 127. The current flowing in the transistor Q2B by the negative component of the input differential signal compensates the current flowing in the transistor Q1 by the positive component of the input differential signal, which means the current flowing in the resistor RC by the positive component of the input differential signal decreases. Also, the current flowing in the transistor Q2 by the positive component of the input differential signal compensates the current flowing in the transistor Q1B by the negative component of the input differential signal, which means that the current flowing in the resistor RCB by the negative component of the input differential signal decreases.

The gain of the VGA 121 also depends on resistors. For instance, resistance of the resistors, RE1, RE1B, RE2, and RE2B, and the current flowing in the transistors, Q5 and Q6, are determined such that voltage drops caused in resistors by currents flowing therein become greater than 100 mV; the gains A of the first differential pair 122 and that of the second differential pair 123 are given by:

$$A(Q1,Q1B) = -RC/RE1, \text{ and} \quad (1)$$

$$A(Q2,Q2B) = RC/RE2. \quad (2)$$

Equations above assume that the resistors, RE1 and RE1B, have common resistance RE1, the resistors, RE2 and RE2B, have common resistance RE2, the load resistors, RC and RCB, have common resistance of RC, the transistors, Q1 and Q1B, have dimensions same to each other, and the transistors, Q2 and Q2B, have dimensions also same to each other. From equations (1) and (2), a composite gain AT of the first differential pair 122 and the second differential pair 123 becomes:

$$AT = RC(1/RE2 - 1/RE1). \quad (3)$$

The first current mirror circuit 126 includes two transistors, Q8 and Q9, of a type of pnp-bipolar transistor. The transistor Q8 in the collector thereof is connected to the collectors of the transistors, Q3B and Q4, and the base thereof.

That is, the transistor Q8 in the collector thereof couples with the collectors of the transistors, Q2B and Q2, through the transistors, Q3B and Q4, respectively. The first current mirror circuit 126 causes a current in the transistor Q9 which is in proportional to the collector current of the transistor Q8. The dimensions, or the sizes of the transistors, Q8 an Q9, may determine the proportional co-efficient of the currents flowing in respective transistors, Q8 and Q9. The first current mirror circuit 126 bases the current not contributing the output signal determined by the gain control circuit 128; that is, the collector current of the transistor Q8 is a sum of the collector currents of the transistors, Q3B and Q4.

The power supply Vcc directly biases the emitters of the transistors, Q8 and Q9. The transistors, Q8 and Q9, in the bases thereof are connected to each other. The current flowing in the transistor Q9, which is provided to the second current mirror circuit 127, is proportional to the current flowing in the transistor Q8, and sometimes called as a mirror current; while the current flowing in the transistor Q8 is sometimes called as a reference current.

The second current mirror circuit 127, which is directly connected to the first current mirror circuit 126, includes two transistors, Q10 and Q6, of a type of npn-bipolar transistor. The transistor Q10 in the collector thereof couples with the collector of the transistor Q9 and the bases of the transistors, Q10 and Q6.

The transistor Q6 in the base thereof couples with the base of the transistor Q10, in the collector thereof couples with the current node 123a, and the emitter thereof is grounded. The collector current of the transistor Q10 becomes the current of the second current mirror circuit 127 and the collector current of the transistor Q6 becomes a mirror current proportional to the reference current. Accordingly, the collector current of the transistor Q8, which is the reference current of the first current mirror circuit 126, is reflected in the current flowing in the second current mirror circuit 127 as the mirror current. In other words, the current flowing in the transistors, Q3B and Q4, is directly reflected in the currents flowing in the transistors, Q2 and Q2B, through the first and second current mirror circuits, 126 and 127.

Next, an operation, and advantageous of the driver 12 thus configured will be described as comparing with an operation of a conventional driver.

In a multi-level modulation, a driver that drives an LD or an optical modulator is requested to amplify an input signal (a modulation signal) linearly to amplitude enough to drive those devices. Generally, the DAC provides the input signal through a transmission line formed on a printed circuit board, but transmission loss due to the transmission line varies depending on lengths of the transmission line because those lengths of the transmission line on the printed circuit board could not define uniformly. One solution is that the DAC may enhance a gain in higher frequency regions compared with a gain in lower frequency regions, which is often called as pre-emphasis and shapes eye diagrams at the input terminal of the driver. However, because the transmission loss varies in port to port, the amplitude of the input signal to which the pre-emphasis above is carried out varies in port to port. In addition, the signal just output from the DAC also inherently varies in the amplitude thereof. Accordingly, the driver is necessary to amplify the input signal linearly even the input signal in the amplitude thereof varies in a range of 200 to 800 mVppd.

On the other hand, the driving signal output from the driver is necessary to have amplitude of, for instance, 5 Vppd to drive the LD or the optical modulator stably even when the input signal varies in 200 to 800 mVppd. That is, the driver is requested to vary the gain thereof in a wide range as keeping the linearity between the input and output signals. Conventionally, a technique to increase an operational current of the amplifier is known to vary the gain thereof as keeping the linearity of the circuit. However, this technique inevitably increases the power consumption of the amplifier. In an alternative, a compensation of a non-linearity in a trans-conductance may secure the linearity. The latter technique decreases the gain thereof in a compensation of the enhancement of the linearity, which results in an increase of the operational current and/or an increase of an amplifying stage, which means that the power consumption of the amplifier increases. The linearity may be also secured by tracing the performance of the LD or the optical modulator independently. However, this technique assumes that the signal input to the driver is kept constant in the magnitude thereof, and a variable amplifier is necessary in upstream the driver to set the signal input to the driver in constant, which results in the increase of the total power consumption of the driver. Thus, conventionally, the maintenance of the linearity conflicts with the reduction of the power consumption.

The driver 12 of the present embodiment provides the transistors Q1, which receives the positive component of the input differential signal, in the first differential pair 122 whose collector is connected to the collector of the transistor Q2B, which receives the negative component in the input differential signal, in the second differential pair 123; also, the transistor Q1B in the first differential pair, which receives the negative component of the input differential signal, is connected in the collector thereof to the collector of the transistor Q2, which receives the positive component of the input differential signal, in the second differential pair. Moreover, the current, which is divided by the gain control circuit 128 and shows no contribution to the output signal, enters the first current mirror circuit 126 as the reference current thereof. This reference current is reflected in the mirror current in the first current mirror circuit 126 that becomes the reference current of the second current mirror circuit 127. The reference current in the second current mirror circuit 127 is reflected in the mirror current generated by the transistor Q6 as the mirror current of the second current mirror circuit 127. Thus, the current not contributing to the output signal may be reflected in the mirror current by the transistor Q6. The transistor Q6 in the collector thereof is coupled to the current node 123a. Accordingly, the current therein substantially equal to the current not contributing the output signal flows in the second differential pair 123.

The current flowing in the current node 124a is a sum of two currents each flowing in the transistors, Q1 and Q2B. Because the bases of the transistors, Q1 and Q2B, are modulated by the positive and negative components of the input differential signal; the current flowing in the current node 124a substantially becomes a subtraction of these two currents, that is, the current flowing in the transistor Q2B subtracted from the current flowing in the transistor Q1. Similarly, the current flowing in the current node 125a becomes a subtraction of the two currents flowing in the transistor Q2 and the current flowing in the transistor Q1B, respectively. Thus, such a subtraction of the currents flowing in the current nodes, 124a and 125b, may compensate the non-linearity of the current appearing in the outputs by setting an adequate gain and the current combination. Consequently, the linearity of the composite current, which adds the current by the transistor Q1 to the current by the transistor Q2B at the current node 124a, may enhance. Such compensation of the non-linearity is often carried out when the input differential signal has relatively greater magnitude and the gain is necessary to be reduced. On the other hand, when the input differential signal in the amplitude thereof is relatively smaller and the gain is unnecessary to be reduced, the linearity of the current by the transistor Q1 may be secured without the compensation by the current from the transistor Q2B. Accordingly, when the input differential signal in the magnitude thereof is relatively smaller, the current flowing in the transistor Q2B, which may be determined by the gain control circuit 128, is set smaller. Thus, the driver 12 of the present embodiment may realize enough linearity in a wide range of a gain by a unique circuit topology.

Figure 3A:
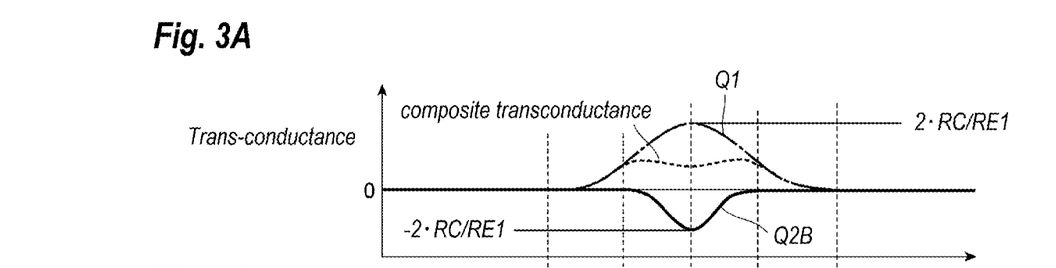
FIGS. 3A and 3B show trans-conductance and collector currents, respectively, of transistors in an input stage against input differential signal.
Figure 3B:
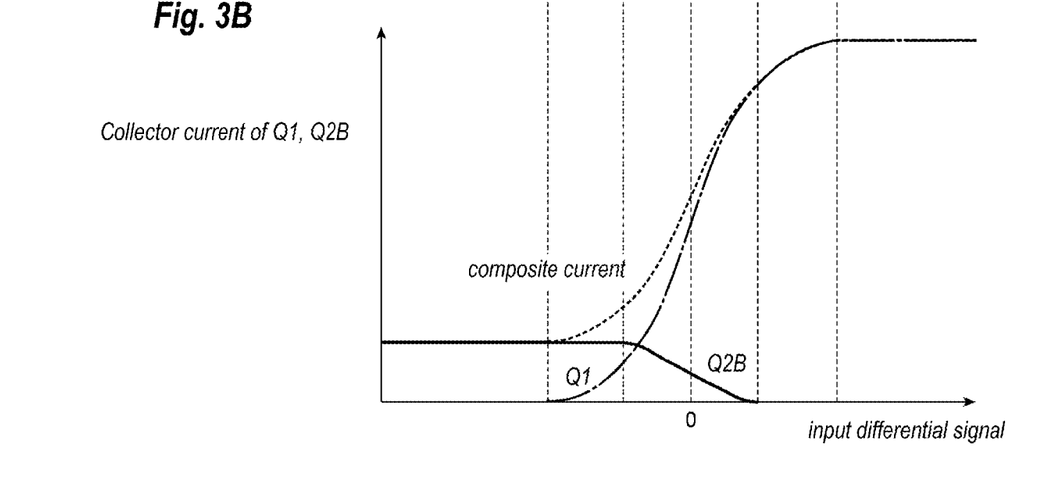
Figure 4:
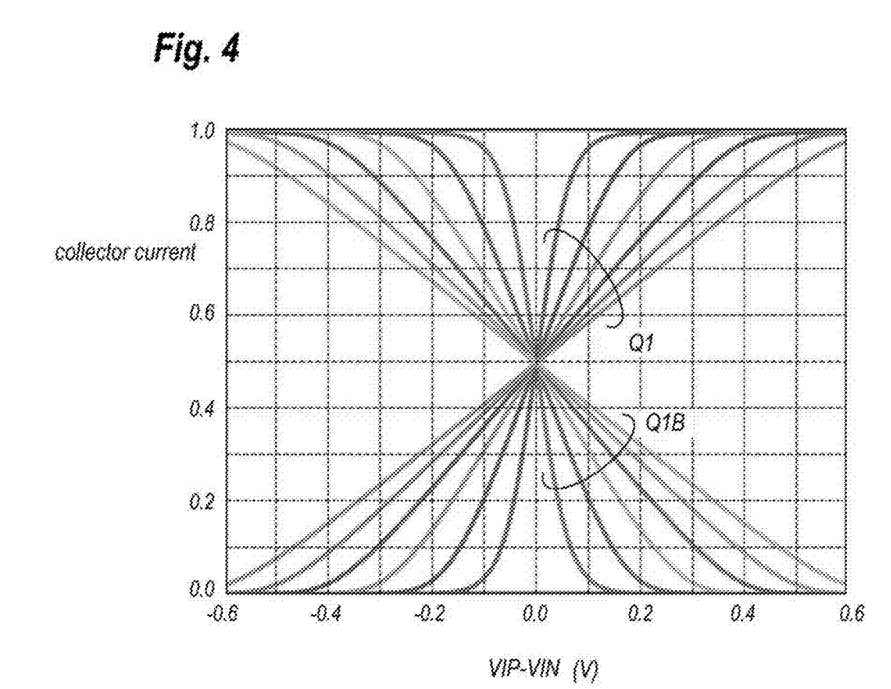
FIG. 4 shows behaviors of collector currents against differential inputs.

The compensation of the non-linearity described above will be further explained as referring to FIGS. 3A and 3B, and FIG. 4. FIGS. 3A and 3B show behaviors of the collector currents of the transistors, Q1 and Q2B, and the trans-conductance thereof against the input signal input to the terminals, VIP and VIN. The trans-conductance corresponds to a differential co-efficient, namely, a slope of the collector current against the input signal. The input signal is a difference between the positive component and the negative component of the input differential signal.

Chain lines and sold lines show the trans-conductance of the collector current of the transistors, Q1 and Q2B, respectively, while dotted lines correspond to those of the composite current. As the input signal becomes larger, the collector current of the transistor Q1 increases and the differential pair switches, that is, the transistor Q1 turns on while the transistor Q2B turns off. Thus, the collector current of the transistor Q1 becomes equal to the current by the transistor Q5. The current by the transistor Q5 fully flows in the transistor Q1, and transistor Q1B fully turns off. While, the collector current of the transistor Q2B decrease as the input signal increases because the second differential pair oppositely receives the input differential signal. The trans-conductance of the composite current, which adds the collector current of the transistor Q1 with the collector current of the transistor Q2B, decreases around a region where the input signal becomes zero.

Setting a range, at which the second differential pair shows non-saturated operation, narrower than that at which the first differential pair operates in non-saturated; the compensation by the second differential pair 123 may be effective only around zero of the input signal, but in other regions except for around zero of the input signal, the compensation by the second differential pair 123 may be substantially eliminated, and only the first differential pair 122 contributes the gain of the VGA 121. Thus, adequately setting the ranges of the non-saturated operations of the differential pairs, the composite current may increase the linearity thereof, and the trans-conductance thereof may become flat in a wider range of the input signal.

FIG. 4 shows behaviors of the composite current, which adds the collector current of the transistor Q1 with the collector current of the transistor Q2B, against the input differential signal. In FIG. 4, innermost behavior shows a case where the emitter resistors, RE1 and RE1B, generate no voltage drops (0 V), namely, the emitters in the first differential pair are short-circuited; and other behaviors appearing outwardly correspond to voltage drops by the emitter resistors, RE1 and RE1B, of 50, 100, 150, 200, and 250 mV, respectively.

As FIG. 4 indicates, the linearity increases as the voltage drop by the emitter resistors, RE1 and RE1B, increases, but the gain reduces, where the gain may be denoted by a slope of the behaviors. The driver 12 of the present embodiment sets the emitter resistors, RE1, RE1B, RE2, RE2B, and the currents by the transistors, Q5 and Q6, such that the voltage drop by the emitter resistors, RE2 and RE2B, becomes smaller than that by the emitter resistors, RE1 and RE1B. When two transistors, Q1 and Q1B, show performance substantially same with each other; the emitter resistors, RE1 and RE1B, preferably have the resistance same to each other. Also, when two transistors, Q2 and Q2B, show performance substantially same with each other; the emitter resistors, RE2 and RE2B, preferably have the resistance same to each other.

The enhancement of the linearity will be described as referring to FIGS. 5 to 7. Assuming that the VGA 121 outputs the output signal with the amplitude of 650 mVppd and the input differential signal has the amplitude of 200 to 800 mVppd, the VGA 121 is necessary to have a gain thereof in a range of 0.8 to 3.5 (−2 to 10 dB) from a ratio of the output signal against the input differential signal. The maximum gain of 10 dB (−3.13) requests a practical gain of 5, which is given by a ratio of the resistance of the resistor RC to that of the emitter resistor RE1, where the present evaluation assumes the former resistance is 125Ω, while the latter is 25Ω. Two emitter resistors, RE1 and RE1B are assumed to have resistance same with each other.

As FIG. 4 indicates, the emitter resistors, RE1 and RE1B, in the voltage drops thereby may determine the linearity, exactly, the range of the unsaturated operation of the transistors. In order to secure the unsaturated operation at the maximum input differential signal of 800 mVppd, the voltage drop by the emitter resistor RE1 is set to be 187.5 mV and the current by the transistor Q5 is set to be 15 mA. The gain attributed to the second differential pair 123 for the compensation of the linearity is set to be 1.78, which automatically determines the resistance of the emitter resistors, RE2 and RE2B, to be 125/1.78~70Ω. The voltage drop by the emitter resistors, RE2 and RE2B, is necessary to be smaller than the voltage drop by the emitter resistors, RE1 and RE1B, which is set in 187.5 mV. In the present embodiment, the former voltage drop is set to be 100 mV, which means that the current by the transistor Q6 is assumed to be 3 mA. This current of 3 mA is determined by the reference current of the first current mirror circuit 126. Thus, the sizes of the transistors, Q8 to Q10 and Q6, are adjusted such that the current ratio by the two transistors, Q6 and Q5, becomes 3/15. Thus, when the gain control signal provided to the terminal Vagc is lower than the reference level of the terminal Vagcref, for instance, the gain control signal in the terminal Vagc is at least −50 mV lower than the reference level of the terminal Vagcref; the current by the transistor Q5 flowing in the first differential pair 122 flows in the transistor Q8 and the output differential signal at the terminals, VOP and VON, decreases in the amplitude thereof.

The collector current of the transistor Q6 becomes the collector current of the transistor Q8 multiplied with the ratio 3/15 due to the first and second current mirror circuits, 126 and 127, which means that the collector currents of the transistors, Q1 and Q1B at the current nodes, 124a and 125a, are substantially decreased by the collector currents of the transistors, Q2B and Q2, respectively, and enhances the linearity of the composite current. On the other hand, when the gain control signal provided to the terminal Vagc exceeds the reference level of the node Vagcref, for instance, when the former level is at least 100 mV higher than the latter level; the collector currents of the transistors, Q1 and Q1B, flow in the respective resistors, RC and RCB, and the output signal provided to the output terminals, VOP and VON, increases the amplitude thereof.

Figure 5A:
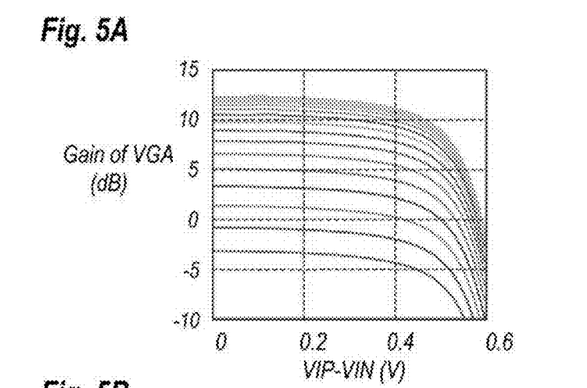
FIGS. 5A, 5B and 5C show gain characteristics against the differential input of a conventional variable gain amplifier.
Figure 5B:
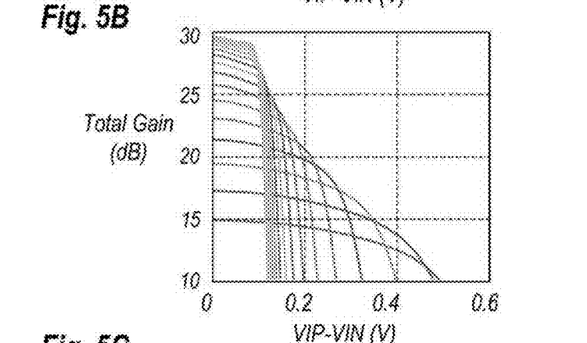
Figure 5C:
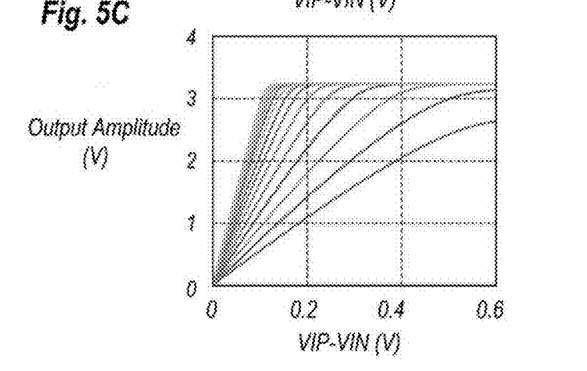

FIGS. 5A to 5C show performance of a VGA comparable to the VGA 121 of the present embodiment, where the comparable VGA implements no second differential pair 123, and the first and second current mirror circuits, 126 and 127. In FIGS. 5A to 5C, the lowermost behavior corresponds to a condition where the gain control signal to the terminal Vagc is −50 mV lower than the reference level of the node Vagcref, and behaviors appearing upwardly correspond to conditions of the gain control signal is increased by 10 mV step to the condition where the gain control signal is 100 mV higher than the reference level.

FIG. 5A shows response of the gain control performance of the comparable VGA against the input differential signal. As the gain control signal increases, the voltage gain increases; but, the dependence of the gain against the amplitude of the input differential signal, which is denoted by VIP-VIN, is small. FIG. 5B shows a total gain of the driver including the post amplifier, but excluding the amplitude detector 132 and the gain controller 133 because the comparable VGA implements no gain control function. Because of insufficient linearity, the total gain of the driver 12 degrades as the input differential signal increases in the amplitude thereof. FIG. 5C shows transfer characteristics of the driver. Also, because of the insufficient linearity, the transfer curve for conditions where the gain of the VGA is set smaller becomes moderate in a region exceeding 0.2 V and finally saturates, or becomes independent of the input signal.

Figure 6A:
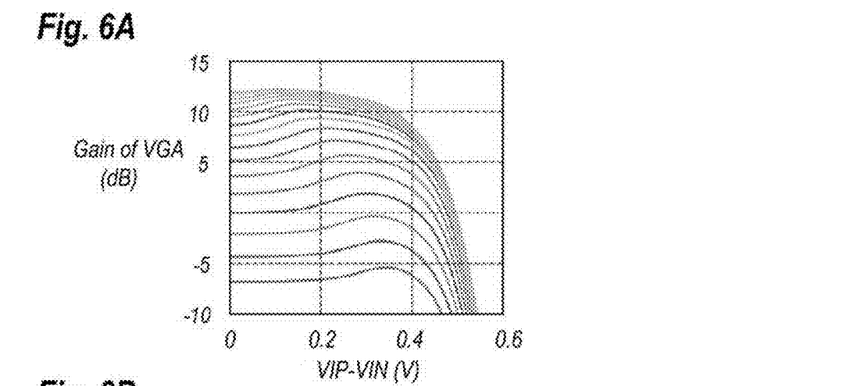
FIGS. 6A, 6B and 6C show gain characteristics against the differential input according to the variable gain amplifier of the present invention.
Figure 6B:
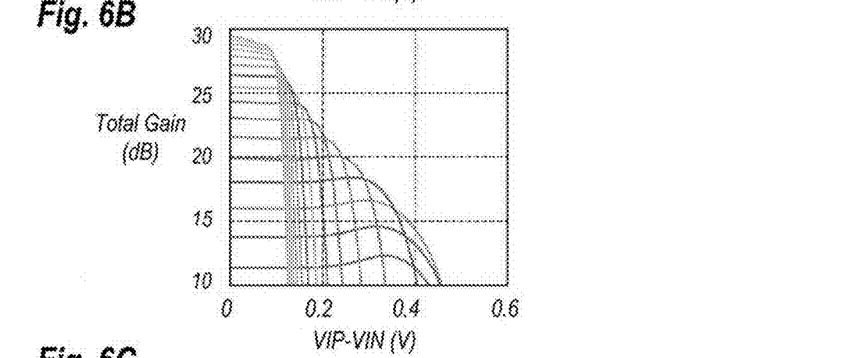
Figure 6C:
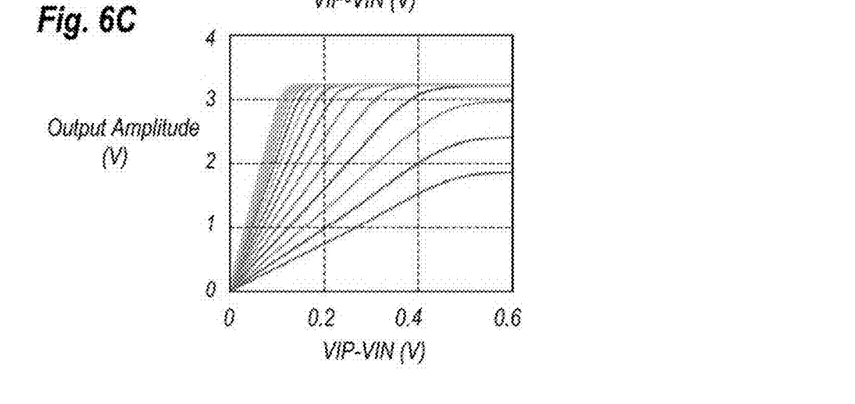

FIGS. 6A to 6C show the performance of the VGA 121, or the driver 12, when respective circuit elements have values described above. In FIGS. 6A to 6C, the lowermost behavior corresponds to a condition where the gain control signal at the terminal Vagc is −50 mV lower than the reference level of the node Vagcref, namely, Vagc=Vagcref−50 mV, and those appearing upwardly correspond to the condition where the gain control signal is increased by a step of 10 mV to the uppermost behavior where the gain control signal is 100 mV greater than the reference level. FIG. 6A shows the gain control characteristic of the VGA 121. Increasing the gain control signal to the terminal Vagc, the voltage gain of the VGA 121 increases, and regions where the gains are independent of the input differential signal, namely, a region where the gains become flat extend from the origin by the gain control function of the present invention. Although FIGS. 6A to 6C only show the region where the input differential signal is positive; respective performances in the region the input differential signal becomes negative are given by the line symmetry with the origin (VIN=VIP) as the symmetry axis. Accordingly, the range where the voltage gain becomes independent on the input differential signal extends to the positive and the negative directions around the origin. As the flat region extends, the linearity of the amplification enhances.

FIG. 6B shows the total gain of the driver. The total gain becomes flat even when the differential input in the amplitude thereof increases from 0 volt because of pre-distorted gain response against the amplitude of the input differential signal in the VGA 121 shown in FIG. 6A. The total gain drastically decreases when the input differential signal exceeds a range at which the VGA 121 shows linear response, but, the driver 12 may secure the enough range of the even gain for the practical operation. FIG. 6C shows the transfer characteristics of the driver 12. Even when the gain of the VGA 12 is set small, the driver 12 shows the satisfactory linearity until the input differential signal in the amplitude thereof reaches about 0.4V. In the evaluation of FIGS. 5A to 5C, for the comparable example, the current flowing in the first differential pair was increased by 3 mA in order to make total current consumption in the VGA substantially comparable to that of the VGA 121 of the invention. Increased current may widen an operable range for the input differential signal, which is reflected in FIG. 5A. However, the driver 12, or the VGA 121 of the present invention may show a wider range of the even gain.

Figure 7:
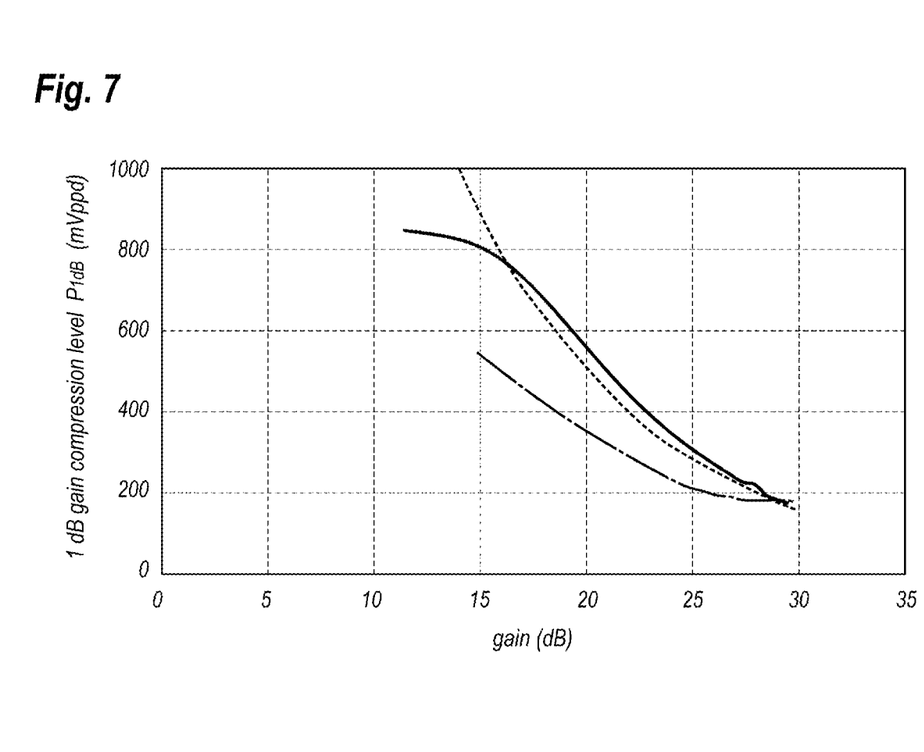
FIG. 7 shows dynamic range against the gain of the variable gain amplifier of the present invention.

FIG. 7 directly shows how the range of the linear operation expands by the VGA 12 of the present invention from the comparable VGA. In FIG. 7, the horizontal axis denotes the total gain of the driver 12, and the vertical axis shows the one (1) dB gain compression level for the input differential signal with respect to the gain at the input differential signals of zero (0) volt. The dotted line in FIG. 7 shows a relation between the gain and an input level required to attain 5 Vppd at the output of the driver 12. Specifically, when the driver 12 has the gain of 20 dB (×10), the driver may generate the output differential signal with the amplitude of 5 Vppd for the input differential signal with the amplitude thereof greater than 500 mVppd. The sold line in FIG. 7 shows a relation between the gain and 1 dB gain compression level $P_{1\ dB}$ of the present embodiment. In a range where the solid line exceeds the dotted line, the driver 12 may output in the amplitude thereof exceeding 5 Vppd without the gain compression. In other words, the range in the gain of the driver 12 from 16.5 dB to 28 dB, where the sold line may exceed the dotted line, which corresponds to an input range from 200 mVppd to 750 mVppd, the driver 12 may output in the amplitude thereof 5 Vppd. The chained behavior in FIG. 7 corresponds to the comparable driver without any compensation by the second differential circuit 122 and the first and second current mirror circuits, 126 and 127. The comparable driver shows no range in the input differential signal exceeding the dotted line.

The driver 12 of the present embodiment in the VGA 121 provides the gain control circuit including the third and fourth differential pairs, 124 and 125, where the former pair 124 includes the transistors, Q3 and Q3B, while, the latter pair 125 includes the transistors, Q4 and Q4B. The transistors, Q3 and Q4B, which are connected to the output terminals, VON and VOP, in the collectors thereof, respectively, receive the gain control signal in the bases thereof, and connected to the current nodes, 124a and 125a, in the emitters thereof, respectively. The transistors, Q3B and Q4, which are connected to the first current mirror circuits 126 in the collectors thereof, receive the reference signal in the node Vagcref in the bases thereof, and connected to the current nodes, 124a and 125a, in the emitters thereof, respectively.

When the input differential signal has relatively larger amplitude, the currents flowing in the transistors, Q3B and Q4B, become relatively larger by decreasing the gain control signal provided to the terminal Vagc compared with the reference level of the node Vagcref. In such a condition, the current by the transistors, Q3B and Q4B, flow in the first current mirror circuit 126, which resultantly increases the current by the transistor Q6 that flows in the second differential pair 123.

On the other hand, when the input differential signal in the amplitude thereof is relatively smaller, the primary portion of the current flowing in the current nodes 124a and 125a, are shunted to the resistors, RC and RCB, which automatically decrease the currents provided to the first current mirror circuit 126. Thus, the current flowing in the transistor Q6 decreases and finally becomes zero, which means no compensation by the second differential pair 123 is carried out. Because the collector current of the transistor Q6 becomes substantially zero, the power consumption of the VGA 121 may be saved. Thus, the VGA 121 of the present invention may enhance the linearity in the transfer characteristic thereof without increasing the power consumption thereof.

The first current mirror circuit 126, which is constituted by transistors, Q8 and Q9, generates the mirror current in the transistor Q9 that reflects a current provided to the transistors, Q3B and Q4B, in the gain control circuit 128, where the latter current is sometimes called as the reference current in a current mirror circuit. The mirror current flowing in the transistor Q9 becomes the reference current of the second current mirror circuit 127 constituted by transistors, Q10 and Q6. The reference current coming from the transistor Q9 is reflected in the current flowing in the transistor Q6 as the mirror current of the second current mirror circuit 127. Finally, the second current is provided to the second differential pair 123. Thus, the collector current of the transistor Q6 may be controlled by the gain control signal. When the input differential signal is relatively small and a higher gain is necessary to beset in the differential pair 122, the gain control signal with respect to the reference signal increases, which decreases the collector current of the transistor Q6 to reduce the compensation by the second differential pair 123, which simultaneously saves the power consumption of the VGA 121. On the other hand, when the input differential signal is relatively small, the gain control signal increases the collector current of the transistor Q6 through two current mirror circuits, 126 and 127, to strengthen the compensation by the second differential pair 123.

The driver 12 of the present embodiment provides the VGA 121 that amplifies the input differential signal, the post amplifier 131 that outputs the driving signal by further amplifying the output of the VGA 12, the amplitude detector that detects the amplitude of the driving signal, and the gain controller that evaluates a difference between the amplitude of the driving signal detected by the amplitude detector and the preset amplitude, and provides to the VGA 121 a gain control signal that eliminates the difference between the amplitude of the driving signal and the preset amplitude. The VGA 121 amplifies the input differential signal with the gain set by the gain control signal. The amplitude detector may detect the amplitude of the driving signal provided to the outside of the driver 12. That gain controller 131 may evaluate the difference between the amplitude of the driving signal and the preset amplitude. The gain control signal may be determined based on thus evaluated difference. This gain control signal may determine the current flowing in the transistors, Q3 and Q4. Thus, the feedback control for the amplitude of the driving signal, which is provided to the outside of the driver 12, may be performed.

Figure 8:
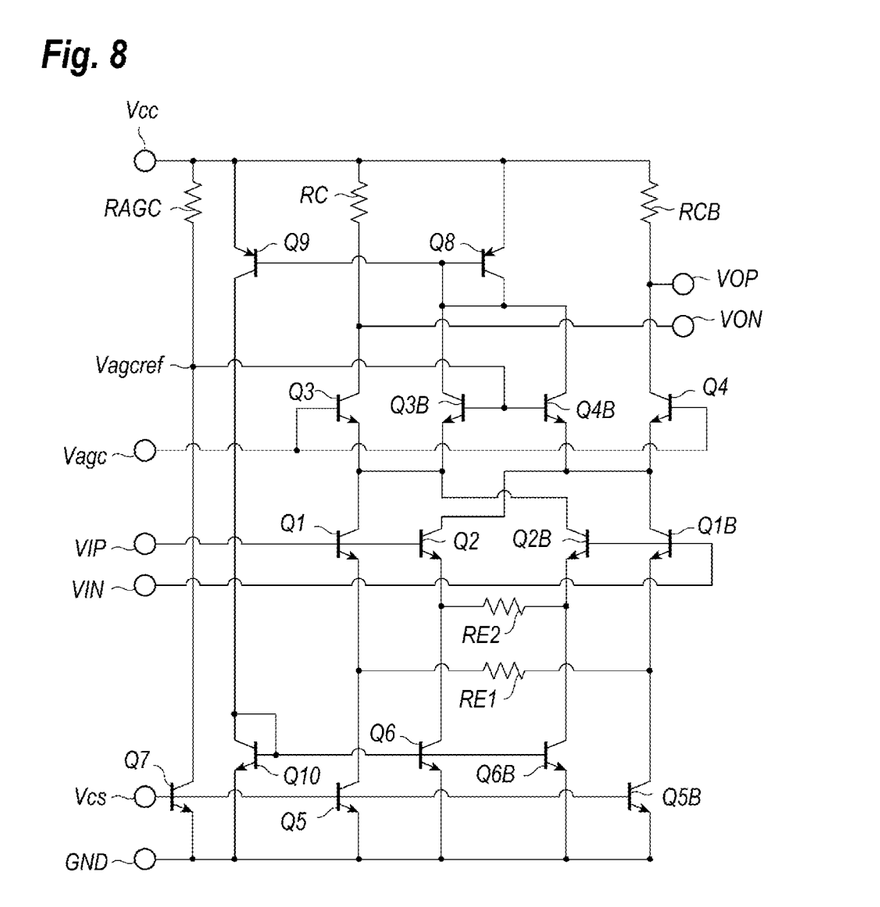
FIG. 8 shows a circuit diagram of another variable gain amplifier according to a modification of the present invention.

In the foregoing detailed description, the driver of the present invention in the arrangement and the operation thereof has been described with reference to specific exemplary embodiments thereof. However, it will be evident that various modifications and changes may be made thereto without departing from the broader spirit and scope of the present invention. For instance, the first and second differential pairs, 122 and 123, may accompany with two current sources, as shown in FIG. 8. That is, transistors, Q1 and Q1B, constituting the first differential pair 122 may connect transistors, Q5 and Q5B, in respective emitters. Also, the transistors, Q2 and Q2B, may connect transistors, Q6 and Q6B in respective emitters thereof. In such an arrangement, the emitters of the former pair of transistors, Q1 and Q1B, are coupled with an emitter resistor RE1, while, those of the latter pair of transistors, Q2 and Q2B, are coupled with another emitter resistor RE2. Moreover, these emitter resistors, RE1 and RE2, have resistance twice of the aforementioned resistors shown in FIG. 2.

Also, the first current mirror circuit 126 may be constituted by p-type MOS (Metal Oxide Metal) transistors. The transistors implemented in the VGA 121 may be types of MOSFET, MESFET, HEMT, and so on replaced from bipolar transistors. Moreover, the first and second current mirror circuits, 126 and 127, in the arrangements thereof are not restricted to those shown in FIG. 2 and FIG. 8. The function of reflecting the feedback current flowing in the transistors, Q3B and Q4B, to the collector currents of the transistors, Q6 and Q6B, with a preset ratio is the unique condition requested to the current mirror circuits, 126 and 127. Accordingly, the present specification and figures are to be regarded as illustrative rather than restrictive.

The present application claims the benefit of priority of Japanese Patent Application No. 2015-207836, filed on Oct. 22, 2015, which is incorporated herein by reference.

I claim:

1. A driver, comprising:
   a variable gain amplifier (VGA) that generates an output signal by amplifying an input signal with a gain set by a gain control signal, the VGA including,
   a first current source that provides a first source current,
   a first differential pair that divides the first source current into a couple of first currents complementary to each other depending on the input signal, and outputs one of the first currents as a first output current,
   a second differential pair that divides a second source current into a couple of second currents complementary to each other depending on the input signal, and outputs one of the second currents as a second output current, the second output current having a phase opposite to a phase of the first output current,
   a gain control circuit that divides, depending on the gain control signal, a sum of the first output current and the second output current into a couple of third currents,
   a first output resistor that generates the output signal generated by the VGA caused by a voltage drop by one of the third currents flowing therein, and
   a second current source that generates the second source current that reflects another of the third currents;
   an amplitude detector that detects amplitude of the output signal generated by the VGA; and
   a gain controller that generates the gain control signal, the gain control signal setting the amplitude of the output signal generated by the VGA in constant.

2. The driver of claim 1,
   wherein the gain control circuit divides a sum of another first output current and another second output current into a couple of fourth currents;
   wherein the VGA further includes a second output resistor that generates another output signal by a voltage drop by one of the fourth currents flowing therein, and
   wherein the amplitude detector detects a difference between the output signal and the another output signal as the amplitude of the output signal.

3. The driver of claim 2, wherein the VGA further includes a first current mirror circuit and a second current mirror circuit, the first current mirror circuit generating a first mirror current that is substantially equal to a sum of the another of the third currents and another of the fourth currents, the second current mirror circuit including the second current source.

4. The driver of claim 3,
   wherein the second current source turns off the second source current when the sum of the another of the third currents and the another of the fourth currents is less than a preset current.

5. The driver of claim 2,
   wherein the gain control circuit includes a third differential pair and a fourth differential pair,
   wherein the third differential pair sets the one of the third currents to be greater than the another of the third currents when the gain control signal is greater than a reference signal, to be smaller than the another of the third currents when the gain control signal is smaller than the reference signal, and to be equal to the another of the third currents when the gain control signal is equal to the reference signal, and
   wherein the fourth differential pair sets the one of the fourth currents to be greater than the another of the fourth currents when the gain control signal is greater than the reference signal, to be smaller than the another of the fourth currents when the gain control signal is smaller than the reference signal, and to be equal to the another of the fourth currents when the gain control signal is equal to the reference signal.

6. The driver of claim 1,
   wherein the second source current is smaller than the first source current.

7. A variable gain amplifier (VGA) that generates an output signal by amplifying an input signal with a variable gain determined by a gain control signal, the VGA comprising:
   a first current source that provides a first source current;
   a first differential pair that divides the first source current into a couple of first output currents depending on the input signal;
   a second differential pair that divides a second source current into a couple of second output currents depending on the input signal, the second output currents having phases opposite to phases of the first output currents;
   a gain control circuit that divides a sum of one of the first output currents and one of the second output currents into a couple of third currents;

a first output resistor that generates the output signal generated by the VGA caused by a voltage drop by one of the third currents flowing therein; and
a second current source that reflects another of the third currents in the second source current.

\* \* \* \* \*